(12) United States Patent
Baier et al.

(10) Patent No.: US 7,049,228 B2
(45) Date of Patent: May 23, 2006

(54) METHOD FOR INTRODUCING STRUCTURES WHICH HAVE DIFFERENT DIMENSIONS INTO A SUBSTRATE

(75) Inventors: Ulrich Baier, Dresden (DE); Oliver Genz, Dresden (DE)

(73) Assignee: Infineon Technologies AG, Munich (DE)

( * ) Notice: Subject to any disclaimer, the term of this patent is extended or adjusted under 35 U.S.C. 154(b) by 58 days.

(21) Appl. No.: 10/756,360

(22) Filed: Jan. 14, 2004

(65) Prior Publication Data

US 2004/0192031 A1 Sep. 30, 2004

(30) Foreign Application Priority Data

Jan. 15, 2003 (DE) ................. 103 01 291

(51) Int. Cl.
*H01L 21/44* (2006.01)
(52) U.S. Cl. .............. 438/667; 438/637; 438/638; 438/668; 438/675
(58) Field of Classification Search .......... 438/68, 438/113–114, 401, 457–460, 462, 494, 498, 438/504, 589, 620, 667–668, 735; 257/118, 257/244, 618, 622–623
See application file for complete search history.

(56) References Cited

U.S. PATENT DOCUMENTS

| | | | | |
|---|---|---|---|---|
| 4,331,708 A | * | 5/1982 | Hunter | 438/424 |
| 4,495,025 A | | 1/1985 | Haskell | |
| 4,957,592 A | * | 9/1990 | O'Neill | 216/2 |
| 5,689,140 A | * | 11/1997 | Shoda | 257/774 |
| 5,726,100 A | * | 3/1998 | Givens | 438/702 |
| 5,753,539 A | | 5/1998 | Okazaki | |
| 5,795,823 A | * | 8/1998 | Avanzino et al. | 438/639 |
| 6,043,164 A | | 3/2000 | Nguyen et al. | |
| 6,114,221 A | * | 9/2000 | Tonti et al. | 438/455 |
| 6,222,210 B1 | * | 4/2001 | Cerny et al. | 257/194 |
| 6,228,774 B1 | * | 5/2001 | Marquez | 438/710 |
| 6,248,429 B1 | * | 6/2001 | Akram et al. | 428/210 |
| 6,265,757 B1 | * | 7/2001 | Brady et al. | 257/623 |
| 6,274,438 B1 | * | 8/2001 | Maari | 438/275 |
| 6,303,466 B1 | * | 10/2001 | Shimonishi et al. | 438/424 |
| 6,312,994 B1 | * | 11/2001 | Nakamura | 438/279 |
| 6,444,588 B1 | * | 9/2002 | Holscher et al. | 438/737 |
| 6,627,510 B1 | * | 9/2003 | Evans et al. | 438/401 |
| 6,667,221 B1 | * | 12/2003 | Kitazawa et al. | 438/401 |
| 6,680,542 B1 | * | 1/2004 | Gibson et al. | 257/774 |
| 6,858,377 B1 | * | 2/2005 | Shu | 430/314 |
| 2004/0188383 A1 | * | 9/2004 | Lucas et al. | 216/54 |
| 2005/0029630 A1 | * | 2/2005 | Matsuo | 257/628 |

* cited by examiner

*Primary Examiner*—Luan Thai
(74) *Attorney, Agent, or Firm*—Slater & Matsil, L.L.P.

(57) ABSTRACT

A process for introducing structures that have different dimensions, particularly with regard to depth, in which just one lithography level is required, is disclosed. This is achieved by use of a layer stack deposited on a substrate, where one layer in particular is used to store information related to the dimensioning of the different structures. The layer is partially opened up to expose the substrate at locations corresponding to where deep structures are to be formed. Deep structures are subsequently etched into the substrate, after which the layer is opened up at locations corresponding to where shallow structures are to be formed. The latter locations are subsequently etched to the desired depth of the shallower structures. The process can be used instead of conventional the dual damascene technology for the structuring of contact holes and interconnects.

14 Claims, 6 Drawing Sheets

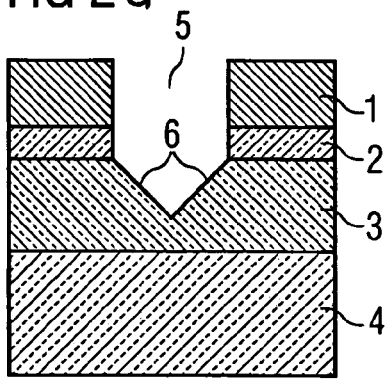
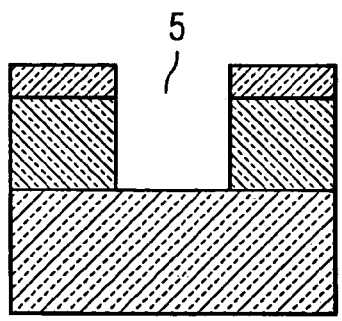
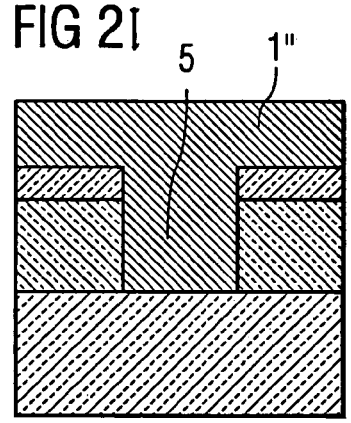
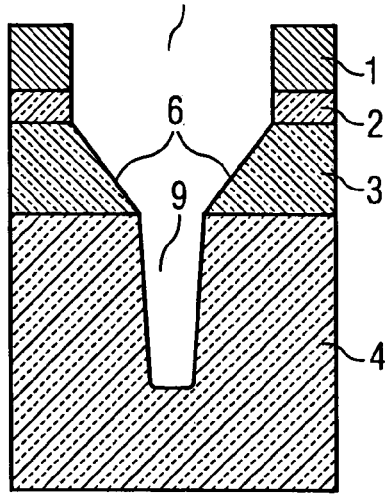
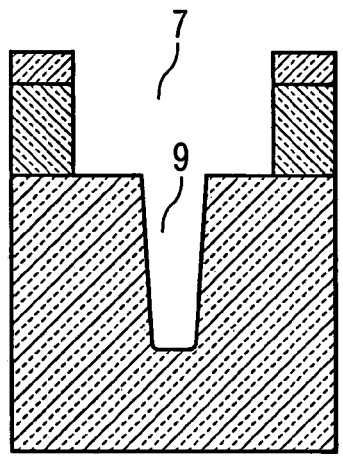
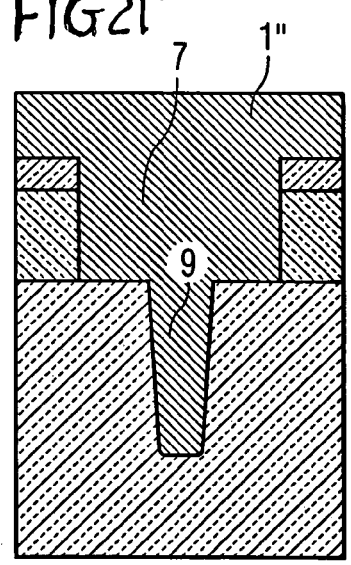

METHOD FOR INTRODUCING STRUCTURES WHICH HAVE DIFFERENT DIMENSIONS INTO A SUBSTRATE

BACKGROUND

1. Field of the Invention

The invention relates to a process for patterning a substrate, and more particularly for introducing structures which have different dimensions, in particular with regard to the depth, into a substrate

2. Background Information

Structures with different dimensions, in particular with regard to the depth in a substrate, are very often used in Very Large Scale Integration (VLSI) technology, such as in the context of multilayer metallization.

Two metal or interconnect levels which lie above one another and are separated from one another by an electrically insulating interlayer are electrically connected to one another by contact structures running perpendicular to the levels. The contact structures, which are also referred to as contact holes, are introduced into the insulating interlayer, and are generally filled with a metal and extend from an upper interconnect level to the next interconnect level down.

A process for the structuring of an interconnect level with contact holes which is currently in widespread use is the dual damascene process, in which interconnects and contact holes are introduced into the insulating interlayer as an inlay. In a single damascene process, structures of a certain depth, i.e. interconnect or contact holes, are etched into a substrate, and the etched recesses in the substrate are filled with a material, e.g., metal, in the case of interconnects. Excess material on the surface of the substrate is removed by etching back or a Chemical Mechanical Polishing (CMP) step. The dual damascene process makes it possible for structures with two different depths to be structured in the substrate, for example contact holes and interconnects, as an inlay in the manner described. A dual damascene process requires two lithography levels, each having a mask which is to be imaged onto the substrate and includes the arrangement of the structures, one mask predetermining the arrangement of the shallower structure, e.g., interconnects, and the other mask predetermining the arrangement of the deeper structure, e.g., contact holes.

The structuring of the substrate for a dual damascene process for the introduction of interconnects and contact holes into the substrate is roughly outlined in FIGS. 1A–F. Substrate 4 is provided with a photosensitive layer 1 (FIG. 1A), onto which a mask 14 (FIG 1B), which includes an interconnect arrangement, is then imaged by means of a lithography step. After patterning of photosensitive layer 1, during which step photosensitive layer 1 is partially opened and substrate 4 becomes visible in the openings 10 (FIG. 1C), the trenches 11 for the interconnects are etched into substrate 4 down to a predetermined depth, as depicted in FIG. 1D. Photosensitive layer 1 is removed and replaced with a new photosensitive layer 1', illustrated in FIG. 1E. Mask 15, which includes a contact hole arrangement, is imaged onto the new photosensitive layer 1' in a second lithography step (FIG. 1F). After photosensitive layer 1' has been patterned (FIG. 1G), deep trenches for the contact holes 12 are etched into substrate 4 (FIG. 1H). Finally, all the structures in the substrate 4 are filled with metal, and excess metal on the surface of the substrate 4 is removed (not shown).

The processing order can also be reversed, i.e. structuring of the contact holes can be performed first, followed by structuring of the interconnects. In any event, the introduction of structures with two different depths requires two lithography levels which have to be precisely matched to one another. On the one hand, the two mask layouts have to fit one another, and on the other hand they have to be highly accurately imaged onto one another, with even the slightest misalignment in the two layouts making the entire structuring unusable. When the second mask plane is being aligned with respect to the first, the coverage accuracy of the exposure unit constitutes an obstacle, i.e. the quality of alignment of the two mask levels with respect to one another is limited. The lack of error tolerance with regard to the relative alignment of the two levels leads to a reduction in production yield, which in turn increases the costs of VLSI products.

It will therefore be appreciated that a need exists to develop a better process for introducing a plurality of structures which include structures of different depth into a substrate.

SUMMARY

In an embodiment of the present invention, a process for introducing structures which have a different depth into a substrate which only requires one lithography level is employed. A further embodiment of the invention provides a mask for carrying out the single lithography level process.

An exemplary embodiment of the present invention includes a layer that stores the information relating to a depth of structures in a substrate being applied to the substrate. After the layer has been partially opened up in a first etching step, the deeper structures are introduced into the substrate. Information concerning the shallower structures remains stored in the layer as trenches, which have not yet been opened up. In this way, it is possible for structures that have a different depth in the substrate to be introduced into the substrate with just one lithography level, just one mask, which includes the arrangement of the structures, and just one etching process in a single etching chamber.

The advantages of the process according to the invention are clear: instead of two masks, just one mask, which includes the arrangement of deeper and shallower structures, is required. There is no need to align two different mask layouts to one another, as the features are automatically self-aligned to each other within a single mask. Moreover, an error source resulting from a misalignment of the two masks, which leads to a reduced yield, is avoided. Since alignment, exposure, and etching of the second lithography plane are no longer required, production throughput can be increased, which directly reduces the costs.

An alternative to the etching process that produces inclined sidewalls is an etching process whose etching rate is dependent on the ratio of depth to width, i.e. on the aspect ratio of the structure to be etched. In a process of this type, the depth of wide structures is etched more quickly than that of less wide structures. A partial opening (partial exposure of the layer below) up of the second layer is achieved by a suitable selection of the etching time.

In the text which follows, the process according to the invention is explained in more detail with reference to the Figures.

BRIEF DESCRIPTION OF THE DRAWINGS

FIG. 2A–2K illustrate a diagrammatic sequence of the process steps for introduction of structures of different depth into a substrate, according to an exemplary embodiment of the present invention.

DETAILED DESCRIPTION

Figure 1A:
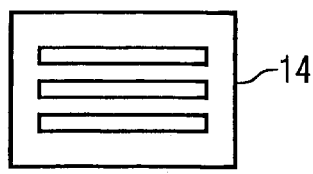
FIGS. 1A–1H illustrate a diagrammatic sequence of the process steps according to the prior art for introduction of structures of different depths into a substrate.
Figure 1B:
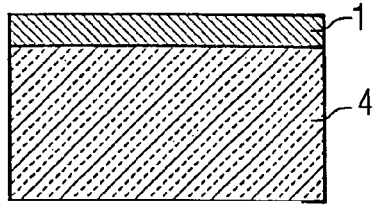
Figure 1C:
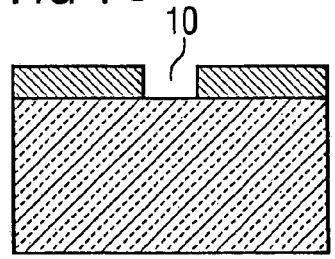
Figure 1D:
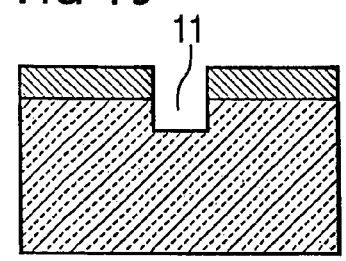
Figure 1E:
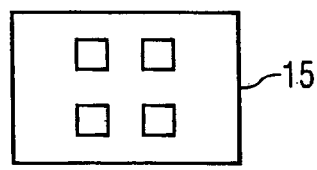
Figure 1F:
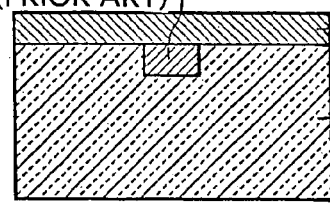
Figure 1G:
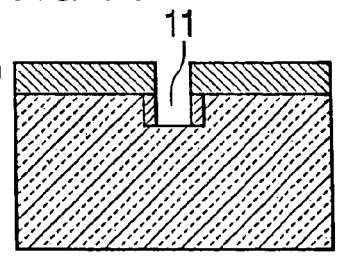
Figure 1H:
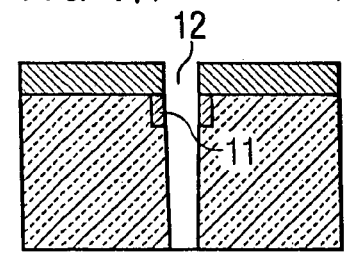

The following list of symbols is used consistently throughout the text and drawings.

List of Reference Symbols

1 Photosensitive layer
1' New photosensitive layer
1" Further photosensitive layer
2 First layer
3 Second layer
4 Substrate
5 Small opening
6 Inclined sidewalls
7 Large opening
8 Shallow structure
9 Deep structure
10 Opening
11 Interconnect
12 Contact hole
13 Mask
14 Mask for interconnect structuring
15 Mask for contact hole structuring The present invention relates to a process for employing a single mask to produce a set of deep and a set of shallow structures that are aligned with respect to one another within a substrate. After a layer has been partially opened up in a first etching step, the deeper structures are introduced into the substrate. To enable the layer, which stores information relating to the depth of the structures, to be only partially opened up for the deeper structures, the first etching step uses an etching process which produces inclined sidewalls. This process has the advantage that a slope angle α between the inclined sidewalls and a horizontal can be controlled as an additional process parameter by means of adjustable etching process parameters.

In an exemplary embodiment, mask features that correspond to deep structures to be produced in the substrate have larger dimensions than features which are used to produce shallower features in substrate. A photosensitive layer is exposed using the mask and developed using conventional lithography processing, resulting in a set of small and large openings (or features), being formed in the photosensitive layer 1.

Figure 2A:
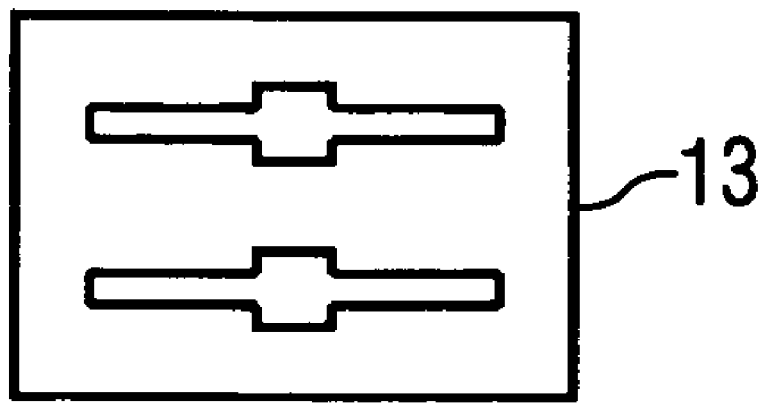
Figure 2B:
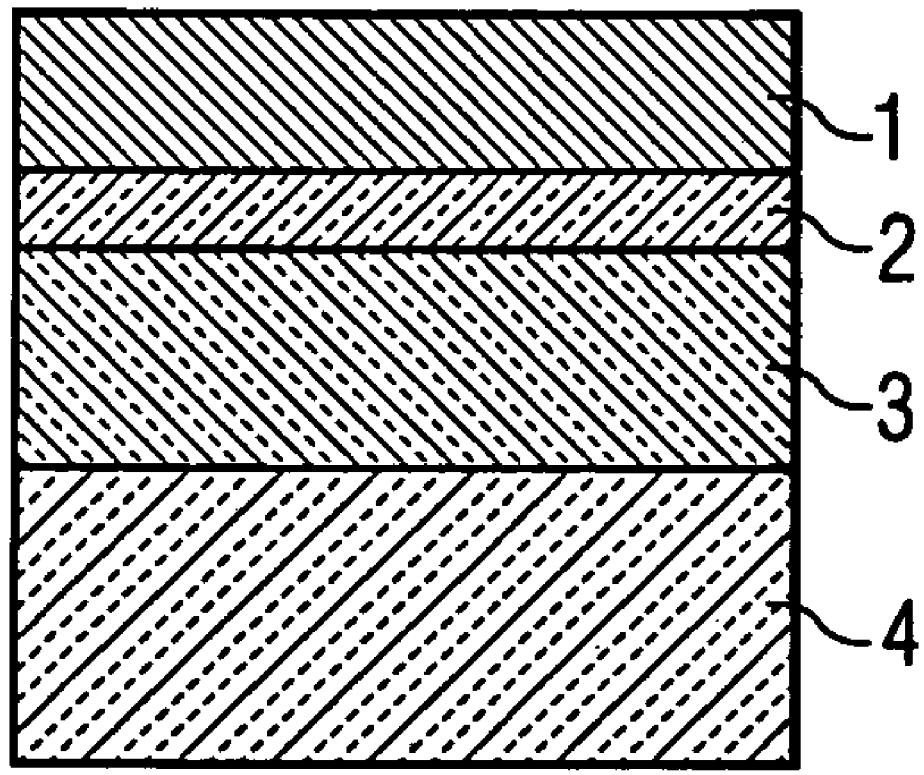

FIGS. 2A–K outline the significant process steps involved in a process according an embodiment of the present invention, in which the substrate 4 is covered with a stack comprising at least two layers of different materials, and a photosensitive layer 1 is applied to the top layer (FIG. 2B). Structures defined by mask 13 (FIG. 2A) according to the present invention, and having a different depth in the substrate 4, are produced by first imaging a pattern onto a photosensitive layer by means of a lithography step.

Figure 2C:
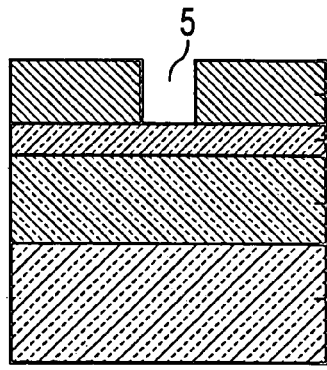
Figure 2D:
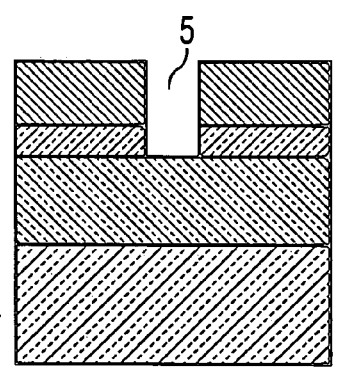
Figure 2E:
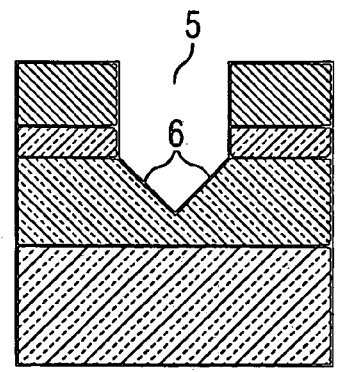
Figure 2C:
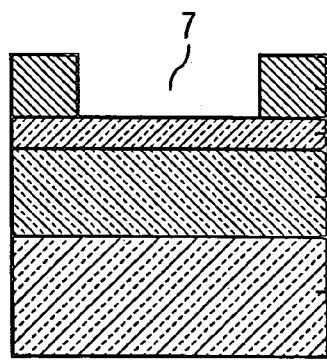
Figure 2D:
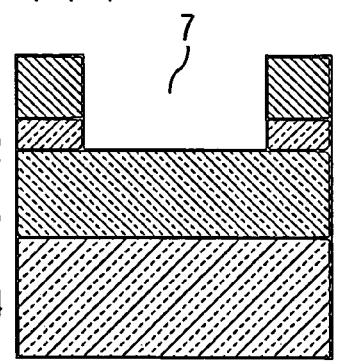
Figure 2E:
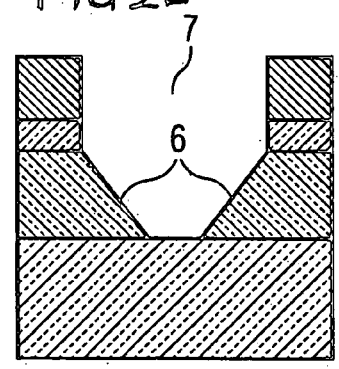
Figure 2F:
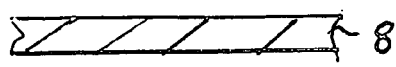
Figure 2F:
Figure 2J:
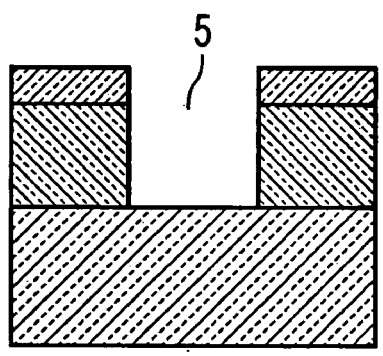

In the discussion to follow, each processing step referred to is depicted by a pair of Figures, in which a top Figure illustrates a cross-sectional view through a small opening region, and a bottom Figure (denoted by a' mark) illustrates a cross-sectional view through a large opening region. FIGS. 2C and 2D depict how a pattern formed in photosensitive layer 1 (FIGS. 2C and 2C') is transferred into layer 2 of the layer stack beneath photosensitive layer 1, so that openings 5 and 7 are formed (FIGS. 2D and 2D', respectively). Subsequently, a layer 3 residing in the later stack, located beneath first layer 2, is etched in a manner that results in layer 3 being etched completely down to substrate 4 at locations corresponding to large opening 7, while layer 3 remains only partially etched at locations corresponding to small opening 5 (FIGS. 2E and 2E'). In a second etching step, substrate 4 is selectively etched with respect to layer 3, down to the desired depth of the deep structures 9 (FIG. 2F'), as depicted in 2G'. However, during the selective etch, the structure corresponding to the smaller openings remains substantially unaltered, as illustrated in FIG. 2G. In a preferred embodiment of the present invention, using an additional etching step, layer 3 is opened up at all the locations at which layer 2 has an opening (FIGS. 2H and 2H'). Subsequently, in an optional step, a further photosensitive layer 1", which fills all the openings, is applied (FIGS. 2I and 2I'). In an exemplary embodiment, photosensitive layer 1" is etched back to below a lower edge of layer 3 in the deep structures 9 (FIG. 2J'), and completely in small openings 5 (FIG. 2J). In a final etching step depicted in FIGS. 2K and 2K', substrate 4 is etched to the depth of the desired shallow structures 8 (FIG. 2F). Application of photosensitive layer 1" is required if a layer at which the deep structures end is to be protected, or if the width of the deep structures would be excessively widened by the fourth etching step. If neither of these factors represents a problem, it is also possible to omit the application of the further photosensitive layer 1".

Figure 2K:
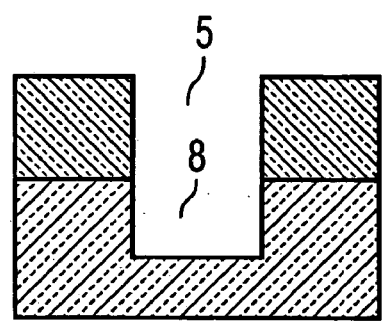
Figure 2J:
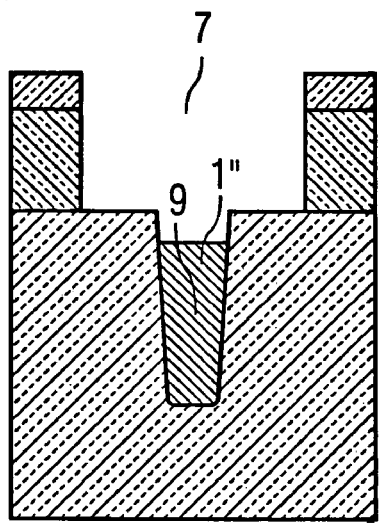
Figure 2K:
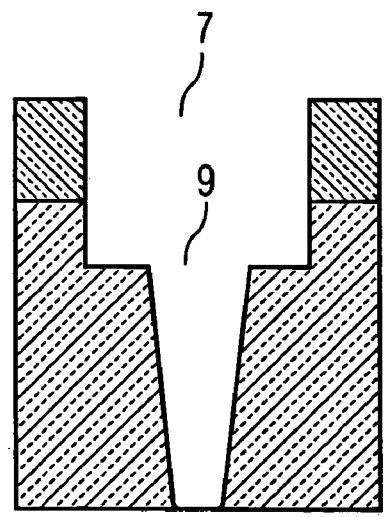

Optionally, the structures depicted in FIGS. 2H and 2H' may be etched such that structures substantially similar to those depicted in FIGS. 2K and 2K' are formed without the use of layer 1".

In an exemplary embodiment, the sequence of layers comprising layers 1, 2, 3, and 4 comprises photosensitive resist, $SiO_2$, polysilicon, and $SiO_2$, respectively.

The process disclosed above is therefore based on a layer which stores information relating to the dimensioning of the structures in a substrate, e.g., layer 3, being applied to substrate 4. The partial exposure of substrate 4 at areas corresponding to large openings, and the subsequent etching of deep structures into substrate 4, while the information about the shallow structures remains stored in layer 3, provides a method to form structures which have a different depth within substrate 4 using just one lithography level, one mask 13, and one etching process.

The process illustrated above provides a criterion to select a thickness h of the second layer, since, given a predetermined width $CD_1$ of the shallow structure in the substrate, the thickness h can be calculated as a function of the slope angle α, as $h = (1+x) \frac{1}{2} CD_1 \tan \alpha$, where x can be selected in the range $0 \leq x \leq 1$. It is advantageous that the thickness of the second layer which is suitable for the overall process management can be set by means of the slope angle α.

A further advantage of the process according to this embodiment results from the fact that a width $CD_3$ with which the deep structures in the substrate are to be provided at the surface of the second layer can be calculated according to $CD_3 = CD_2 + (1+x)CD_1$, where $CD_2$ denotes the predetermined width of the deep structure in the substrate. $CD_3$ is therefore independent of the thickness of the second layer and of the slope angle α and is substantially dependent on the design which predetermines the widths of the structures in the substrate. Thus, a mask for introducing contact holes and interconnects into a substrate can be provided with a suitable structuring without requiring a special etching process. The structure for the contact hole is dimensioned in accordance with the calculated width $CD_3$. Interconnect lengths and a curvature of the interconnects can be selected as desired. Details in which the present invention provides the above advantages are discussed below.

Figure 3A:
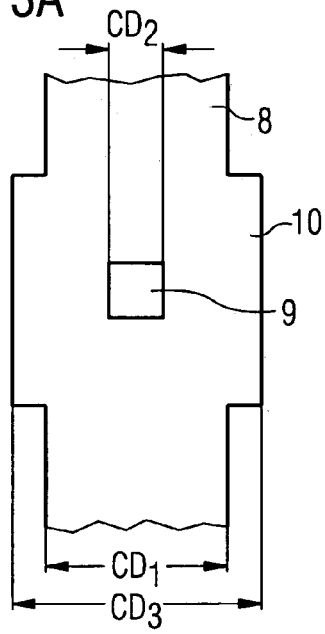
FIG. 3A illustrates a plan view of structures formed in a second layer according to an embodiment of the present invention.
Figure 3B:
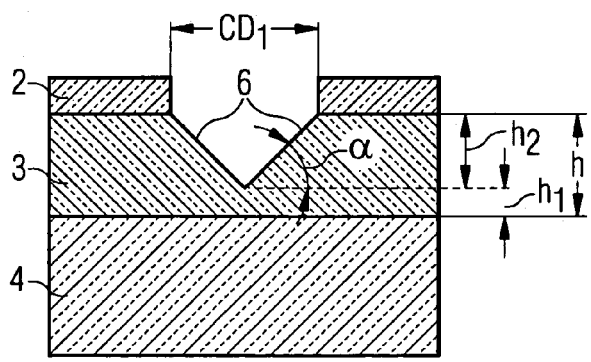
FIGS. 3B and 3C illustrate cross-sectional views of the structure depicted in FIG. 3A.
Figure 3C:
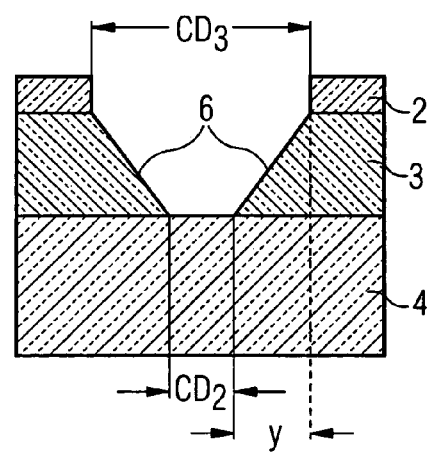

The lateral dimensions of the deep and shallow structures at a depth within the substrate or at the substrate surface, are defined by a design which predetermines an arrangement of structures. In FIG. 3A, the width of shallow structure 8, which is predetermined by design, is denoted by $CD_1$, and the width of the deep structure 9, which is predetermined by design, is denoted by $CD_2$. $CD_3$ denotes the width according to the present invention of opening 10 in layer 2, which is used for the introduction of the deep structure into substrate 4. The partial opening of layer 3 can be achieved by means of an etching process which produces inclined sidewalls 6 in the first etching step, with the slope angle α of the inclined sidewalls 6 being defined by the etching process parameters selected. The thickness h used for layer 3, is dependent on $CD_1$, on the slope angle α, and on the desired distance $h_1$ between the etched depth $h_2$ and the end of the second layer 3, where $h=h_1+h_2$. As can be seen from FIG. 3B, $h_2$ turns out to be $\frac{1}{2}(CD_1 \cdot \tan \alpha)$. The thickness $h_1$ can be selected as desired, for example, $h_1=(x \cdot h_2)$, where $0 \leq x \leq 1$. The thickness h of the second layer 3 then turns out to be $h=(1+x)h_2=(1+x)\frac{1}{2}(CD_1 \cdot \tan \alpha)$. As can be seen from FIG. 3C, $CD_3$ can be given as $CD_3=CD_2+2y=CD_2+2h/\tan \alpha=CD_2+(1+x)CD_1$. $CD_3$ is accordingly independent of the slope angle and of thickness h of layer 3, and is selected in such a way that the second opening in layer 3 toward the substrate 4 has the width $CD_2$.

An example is provided below to further illustrate the above discussion. Example calculation: the parameters $CD_1=110$ nm, $CD_2=110$ nm, $x=10\%$ and $\alpha=80°$ are preset. Using the above formulae for h and $CD_3$, this results in $h=343$ nm and $CD_3=231$ nm. If the slope angle α is selected to be 70° and the other predetermined parameters are maintained, h is calculated to equal 166 nm. $CD_3$ remains unchanged at 231 nm. $CD_3$ is therefore independent of the slope angle α and of the thickness h of the second layer. The exemplary embodiment of the present invention described above, therefore provides a method to achieve a ratio of the structure width or specific line width to space (line/space ratio) of 110/220.

Another embodiment of the present invention for partially opening layer 3, comprises the use of an etching process whose etching speed is dependent on the depth to width ratio, i.e. on the aspect ratio of the structures to be etched, for the first etching step. Structures with a low aspect ratio, i.e. structures which have a large width compared to their depth, are etched more quickly than structures with a high aspect ratio, i.e. structures which have a low width compared to their depth. Deeper structures in the substrate are therefore dimensioned more widely in layer 3 than shallower structures. On account of the different etching rates in structures with different aspect ratios, partial opening of layer 3 is achieved after a certain time. Layer 3 is then open at the locations at which the structures have a low aspect ratio and remains closed at locations at which the structures have a high aspect ratio.

Figure 4:
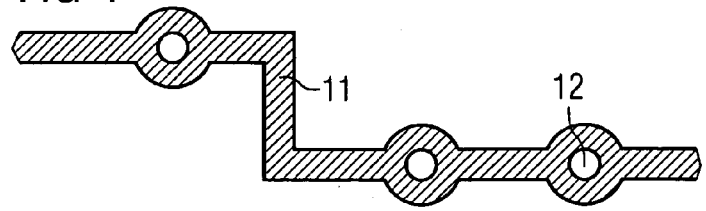
FIG. 4 illustrates a plan view of an interconnect with contact holes according to an embodiment of the present invention.

In a further exemplary embodiment of the present invention, to enable the process described above to be used for the structuring of contact holes 12 and interconnects 11, illustrated in FIG. 4, mask 13 is provided with structures for the introduction of contact holes 12 and interconnects 11 into the substrate 4. The contact holes are dimensioned on the mask in accordance with the above-described calculation of $CD_3$, i.e. the width in of the opening 10.

The length of the interconnects between the contact holes can be selected as desired, and the profile of the interconnects, which may be curved or straight as required, can also be selected freely.

Mask 13 thus may include structures with suitable dimensions for a process for introduction of contact holes 12 and interconnects 11 into substrate 4 for dual damascene structuring.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A process for introducing structures into a substrate, wherein the structures contain a set of deep structures and a set of shallow structures, comprising:
   depositing on the substrate a layer stack comprising at least two layers each containing a different material;
   depositing a photosensitive layer on the top layer of the layer stack;
   patterning the photosensitive layer in a lithographic process using a mask containing a set of smaller and a set of larger features, wherein a set of larger openings are used to form the set of deep structures and a set of smaller openings are used to form the shallow structures;
   developing the photosensitive layer, wherein a set of larger patterned features and a set of smaller patterned features are formed in the photosensitive layer;
   transferring the pattern in the photosensitive layer into a first layer of the layer stack residing beneath the photosensitive layer, wherein the set of smaller and the set of larger openings are formed; and
   etching a second layer of the layer stack beneath the first layer, wherein the second layer is completely etched down to a third layer at locations corresponding to the larger openings, and wherein the second layer is only partially etched so that the second layer remains closed at locations corresponding to the smaller openings.

2. The process of claim 1, wherein the third layer is the substrate.

3. The process of claim 2, wherein the layer stack comprises $SiO_2$ as the first layer, polysilicon as the second layer, and $SiO_2$ as the substrate.

4. The process of claim 1, wherein the etching of the second layer is performed using an etching process whose etching rate is dependent on the ratio of the depth to the width of the structure.

5. The process of claim 1, wherein the set of larger and the set of smaller features in the mask includes features for the introduction of contact holes and interconnects into the substrate.

6. The process of claim 1, wherein the third layer is the substrate, and wherein the process further comprises:
    selectively etching the substrate down to a desired depth of the deep structures;
    etching the second layer, wherein the second layer is completely etched down to the substrate at locations corresponding to both the larger and smaller openings; and
    selectively etching the substrate down to a desired depth of the shallow structures.

7. The process of claim 6, further comprising:
    depositing a blanket layer of a photosensitive material on the patterned openings before selectively etching the substrate down to a desired depth of the shallow structures;
    removing the photosensitive material down to a level below the surface of the substrate; and
    selectively etching the substrate down to the desired depth of the shallow structures.

8. The process of claim 6, wherein an etching process used to etch the second layer produces inclined sidewalls.

9. The process of claim 8, wherein a slope angle $\alpha$ between the inclined sidewalls and a horizontal is defined by selected etching process parameters.

10. The process of claim 8, wherein, given a predetermined width $CD_1$ of the shallow structure in the substrate, and a predetermined slope of angle $\alpha$, a thickness h of the second layer is calculated according to $h=(1+x) \frac{1}{2} CD_1 \tan \alpha$, wherein the value of x ranges from about 0 to about 1.

11. The process of claim 10, wherein the deep structures in the substrate are formed from features in the first layer with a width $CD_3=CD_2+(1+x) CD_1$, wherein $CD_2$ is a predetermined width for the deep structures in the substrate.

12. A mask for forming a set of deep structures and a set of shallow structures in a substrate, comprising:

a first set of larger features for forming the deep structures;
a second set of smaller features for forming the shallower structures, wherein the larger features have a width $CD_3$ with $CD_3=CD_2+(1+x) CD_1$, wherein $CD_2$ is a predetermined width for the deep structures in the substrate, $CD_1$ is the width for the shallow structures in the substrate and the value of x ranges from about 0 to about 1, and the deeper structures and the shallower structures are formed using the mask in a single lithography patterning step.

13. The mask of claim 12, wherein the first set of features is designed to form contact holes and the second set of features is designed to form interconnects.

14. A process for producing self-aligned contacts and interconnects using a single lithography mask level, comprising:
    depositing a photoresist layer on a substrate containing a layer stack deposed thereon for formation of the contacts and interconnects;
    exposing the photoresist layer using a mask containing a set of features for forming the contacts and a set of features for forming connects;
    developing the resist layer, wherein a pattern containing a set of larger features and a set of smaller features is formed;
    etching a first layer of the layer stack residing beneath the photosensitive layer, wherein a set of smaller and a set of larger openings exposing a second layer underneath the first layer are formed;
    etching the second layer of the layer stack beneath the first layer, wherein the second layer is completely etched down to the substrate at locations corresponding to the larger openings, and wherein the second layer is only partially etched at locations corresponding to the smaller openings;
    selectively etching the substrate down to a desired depth of the deep structures;
    etching the second layer, wherein the second layer is completely etched down to the substrate at locations corresponding to both the larger and smaller openings;
    selectively etching the substrate down to a desired depth of the shallow structures;
    depositing a metallic material in the smaller and larger structures; and
    removing excess material not residing substantially within the smaller and larger structures.

* * * * *